US006660987B2

(12) United States Patent
Koshimizu

(10) Patent No.: US 6,660,987 B2
(45) Date of Patent: Dec. 9, 2003

(54) IMAGE READING APPARATUS AND ILLUMINATION APPARATUS

(75) Inventor: Masato Koshimizu, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 133 days.

(21) Appl. No.: 09/834,111

(22) Filed: Apr. 12, 2001

(65) Prior Publication Data

US 2001/0030278 A1 Oct. 18, 2001

(30) Foreign Application Priority Data

Apr. 13, 2000 (JP) ....................................... 2000-112096

(51) Int. Cl.[7] ................................................ H01L 27/00
(52) U.S. Cl. ..................................... 250/208.1; 358/482
(58) Field of Search ......................... 250/208.1, 227.28, 250/559.42, 559.45; 358/471, 474, 482, 483, 494, 497

(56) References Cited

U.S. PATENT DOCUMENTS

| | | | | |
|---|---|---|---|---|
| 5,038,227 A | | 8/1991 | Koshiyouji et al. | 358/471 |
| 5,214,470 A | * | 5/1993 | Denber | 355/75 |
| 5,266,805 A | * | 11/1993 | Edgar | 250/330 |
| 5,586,212 A | * | 12/1996 | McConica et al. | 250/234 |
| 5,923,042 A | * | 7/1999 | Mietta et al. | 250/559.06 |
| 6,201,616 B1 | * | 3/2001 | Sasanuma et al. | 358/450 |
| 6,323,967 B1 | * | 11/2001 | Fujinawa | 358/484 |

FOREIGN PATENT DOCUMENTS

| | | | | |
|---|---|---|---|---|
| JP | 363116551 A | * | 5/1988 | H04N/1/00 |
| JP | A 8-307608 | | 11/1996 | |
| JP | A 10-322519 | | 12/1998 | |
| JP | A 2000-101786 | | 4/2000 | |

OTHER PUBLICATIONS

English Abstract for JPA 8–307608.
English Abstract for JPA 2000–101786.
English Abstract for JPA 10–322519.

* cited by examiner

*Primary Examiner*—Stephone Allen
(74) *Attorney, Agent, or Firm*—Morgan & Finnegan, L.L.P.

(57) ABSTRACT

An object of this invention is to read a high-quality image by detecting and correcting dirt, a scratch, or a watermark present on an original in an image reading apparatus for reading an original. To achieve this object, an original illumination unit in the image reading apparatus for reading an original includes a first light source for emitting light in at least the visible region, a second light source for emitting light in only the invisible region, and a light guide plate which has these light sources at an end face and distributes incident light from the end face to the entire flat surface.

19 Claims, 7 Drawing Sheets

IMAGE READING APPARATUS AND ILLUMINATION APPARATUS

FIELD OF THE INVENTION

The present invention relates to an image reading apparatus for reading image information of an original and an illumination apparatus used in the image reading apparatus.

BACKGROUND OF THE INVENTION

There is conventionally known an image reading apparatus for illuminating a transparent original and reading its image, as disclosed in U.S. Pat. No. 5,038,227. The conventional image reading apparatus will be described with reference to FIGS. 7A and 7B.

FIG. 7A is a sectional view showing an image reading apparatus, and FIG. 7B is a perspective view. A bar-like fluorescent tube 700 is attached to the end of a light guide plate 701 which is arranged in parallel to a platen glass 702 for supporting an original. The light guide plate 701 is a resin light diffusion panel for diffusing light emitted by the fluorescent tube 700 and emitting the light from the surface.

The platen glass 702 is an original table for supporting a transparent original such as a photographic film. A transparent original on the platen glass 702 is sandwiched and fixed between the light guide plate 701 and the platen glass 702. A CCD 703 is a linear imaging element for converting image information into an electric image signal. An imaging optical system 704 optically guides the image information of the transparent original to the CCD 703.

A carriage 705 supports the CCD 703 and imaging optical system 704, and is movable in the subscanning direction along guides 706 and 707. When the entire surface of a transparent original is illuminated by the light guide plate 701, image information of the transparent original is read by the CCD 703 via the imaging optical system 704. The carriage 705 is moved in the subscanning direction to sequentially read the image of the entire transparent original.

If, however, dirt or dust exists on a transparent original or a film surface is scratched, the conventional image reading apparatus reads even the dirt or scratch, so the image degrades owing to the dirt or scratch.

SUMMARY OF THE INVENTION

The present invention has been made in consideration of the above situation, and has as its object to provide an image reading apparatus and illumination apparatus capable of preventing degradation of an image caused by dirt, a scratch, or watermark information on an original surface.

To overcome the conventional drawbacks and achieve the above object, an image reading apparatus according to the first aspect of the present invention has the following arrangement.

That is, an image reading apparatus is disclosed that forms light from an original into an image on a solid-state image sensing element by using an imaging optical system, and reads image information of the original. The image sensing apparatus comprises a first light source for emitting light of a visible region, a second light source for emitting light of an invisible region, and a light guide plate. The light guide plate has the first and second light sources at an end face, guides incident light from the end face along a surface, and emits the incident light from the surface. The image sensing apparatus further comprises image information reading means for reading the image information to the solid-state image sensing element, and light from the original illuminated with light from the first light source that is guided by the light guide plate, where the image information is recorded on the original on the basis of an image signal obtained by guiding. The image sensing apparatus further comprises information reading means for reading second information to the solid-state image sensing element, and light from the original illuminated with light from the second light source that is guided by the light plate, where the second information is presented on an optical path extending from the light guide plate to the solid-state image sensing element on the basis of an image signal obtained by guiding. The image sensing apparatus further comprises correction means for removing the second information read by the information reading means form the image information read by the image information reading means.

An image reading apparatus according to the second aspect of the present invention has the following arrangement.

That is, an image reading apparatus comprises a first light source for mainly emitting light of a visible region, a second light source for mainly emitting light of an invisible region, a light guide plate for guiding light emitted by the first and second light sources along a surface and illuminating an original, and reading means for converting, into an image signal, transmitted light of the transparent original illuminated with light from the first or second light source that is guided by the light guide plate.

An illumination apparatus according to the present invention has the following arrangement.

That is, an illumination apparatus used in an image reading apparatus for forming light from an original into an image on a solid-state image sensing element by using an imaging optical system, and reading image information of the original comprises a first light source for emitting light of a visible region, a second light source for emitting light of an invisible region, and a light guide plate which has the first and second light sources at an end face, guides incident light from the end face along a surface, and uniformly emits the light.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS (First Embodiment)

An image reading apparatus according to the first embodiment of the present invention will be described with reference to the accompanying drawings.

Figure 1:
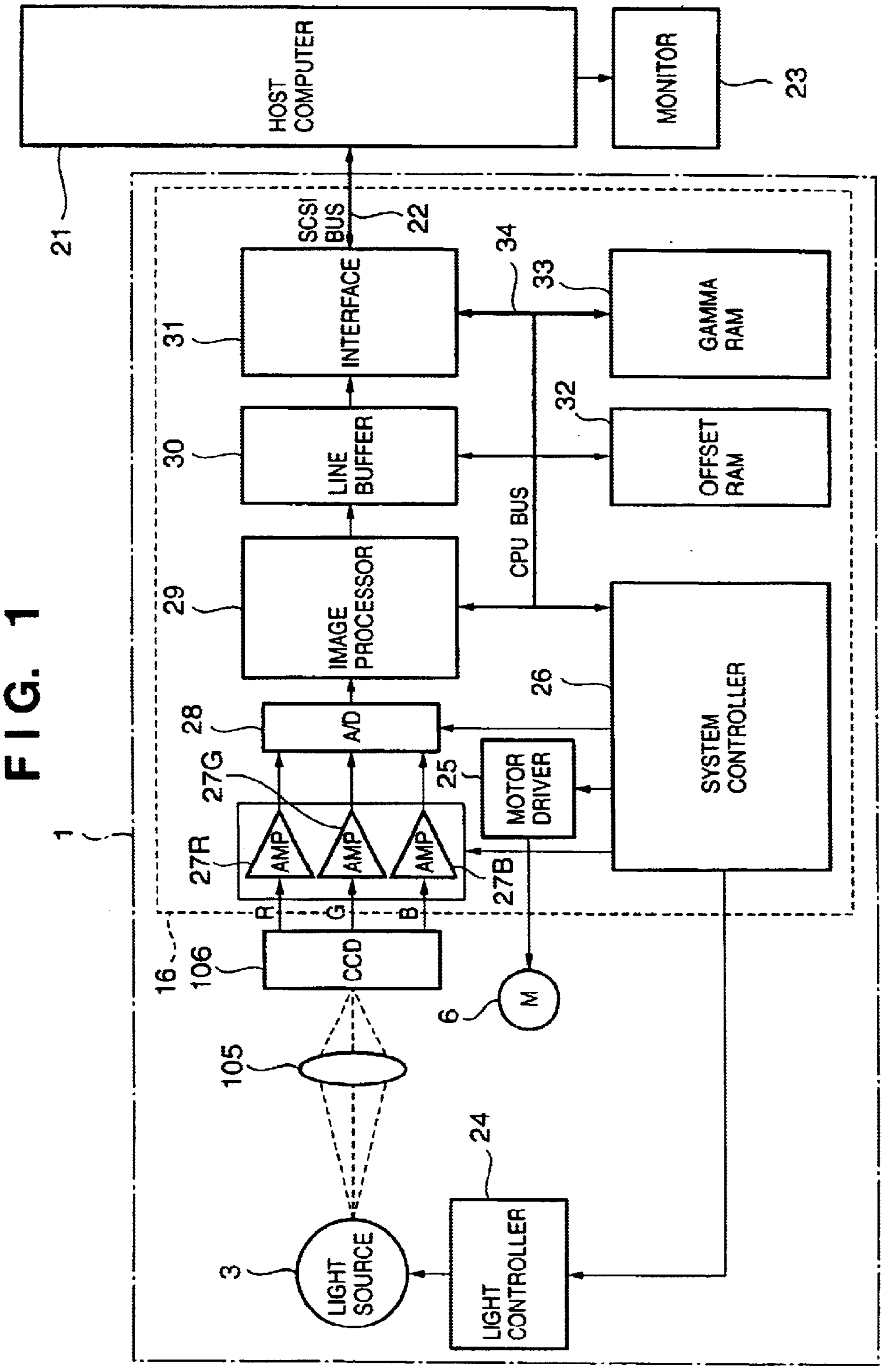
FIG. 1 is a block diagram showing the arrangement of an image reading apparatus according to the first embodiment.

FIG. 1 is a block diagram showing the internal arrangement of the image reading apparatus according to the first embodiment. Respective functional blocks will be explained with reference to FIG. 1. An image reading apparatus 1 is connected to a host computer 21 via a signal cable. The image reading apparatus 1 operates to read an image in accordance with an instruction from the host computer 21, and transfers the image signal to the host computer 21.

Reference numeral 105 denotes an imaging lens for forming light from an original irradiated by a light source 3 into an image on a CCD 106 serving as a solid-state image sensing element; and 24, a light controller for turning on the light source 3. Note that the image sensing element may be a CMOS or the like other than the CCD. On an electric board 16, reference numeral 25 denotes a motor driver for driving a pulse motor 6 and outputting an excitation switching signal for the pulse motor 6 upon reception of a signal from a system controller 26 serving as the system control means of the image reading apparatus (image scanner) 1; and 27R, 27G, and 27B, analog gain adjusters for variously amplifying analog image signals output from the CCD line sensor 106.

Reference numeral 28 denotes an A/D converter for converting analog image signals output from the analog gain adjusters 27R, 27G, and 27B into digital image signals; 29, an image processor for performing image processing such as offset correction, shading correction, digital gain adjustment, color balance adjustment, masking, resolution conversion in the main scanning and subscanning directions for a digital image signal; and 30, a line buffer which temporarily stores image data and is realized by a general-purpose random access memory.

Reference numeral 31 denotes an interface for communicating with the host 21. In this embodiment, the interface 31 is realized by a SCSI controller but may adopt another interface such as a centronics or USB. Reference numeral 32 denotes an offset RAM used as a working area in image processing. The offset RAM 32 is used to correct offsets between R, G, and B lines because the line sensor 106 is constituted by parallel-arranging R, G, and B line sensors with predetermined offsets. The offset RAM 32 also temporarily stores various data for shading correction and the like. In this embodiment, the offset RAM 32 is realized by a general-purpose random access memory.

Reference numeral 33 denotes a gamma RAM for storing a gamma curve for gamma correction. The system controller 26 stores the sequence of the overall scanner as a program, and executes various control processes in accordance with instructions from the host 21. Reference numeral 34 denotes a CPU bus which connects the system controller 26 to the image processor 29, line buffer 30, interface 31, offset RAM 32, and gamma RAM 33, and is made up of address and data buses.

Figure 2:
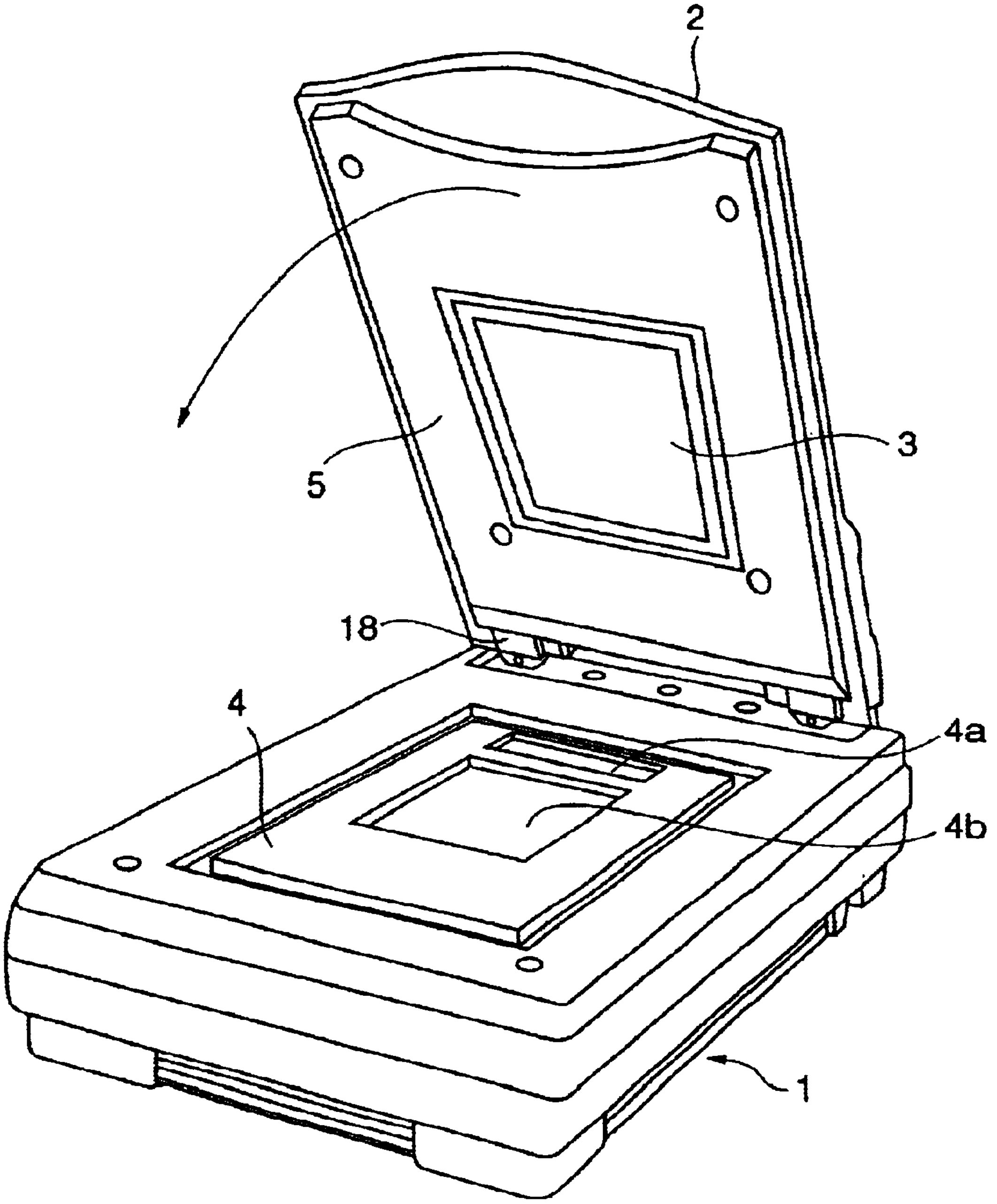
FIG. 2 is a schematic perspective view showing the image reading apparatus according to the first embodiment.

FIG. 2 is a schematic perspective view showing the image reading apparatus according to the first embodiment. As shown in FIG. 2, a transmission illumination unit 2 for illuminating a transparent original in reading the transparent original such as a developed photographic film is pivotally attached to the image reading apparatus 1 through a hinge 18. The transmission illumination unit 2 is attached by fixing the surface light source 3 (to be described later) to a lower unit cover 5 with a screw or the like. The surface light source 3 is protected with a transparent member for protecting a light source.

The main body of the image reading apparatus 1 is equipped with a platen glass 13 for supporting an original to be read. To read a photographic film, a light-shielding sheet 4 is placed on the platen glass 13. A shading window 4*a* of the light-shielding sheet 4 is to measure shading, and a transmission original support portion 4*b* is a location where a transparent original is placed.

Figure 3:
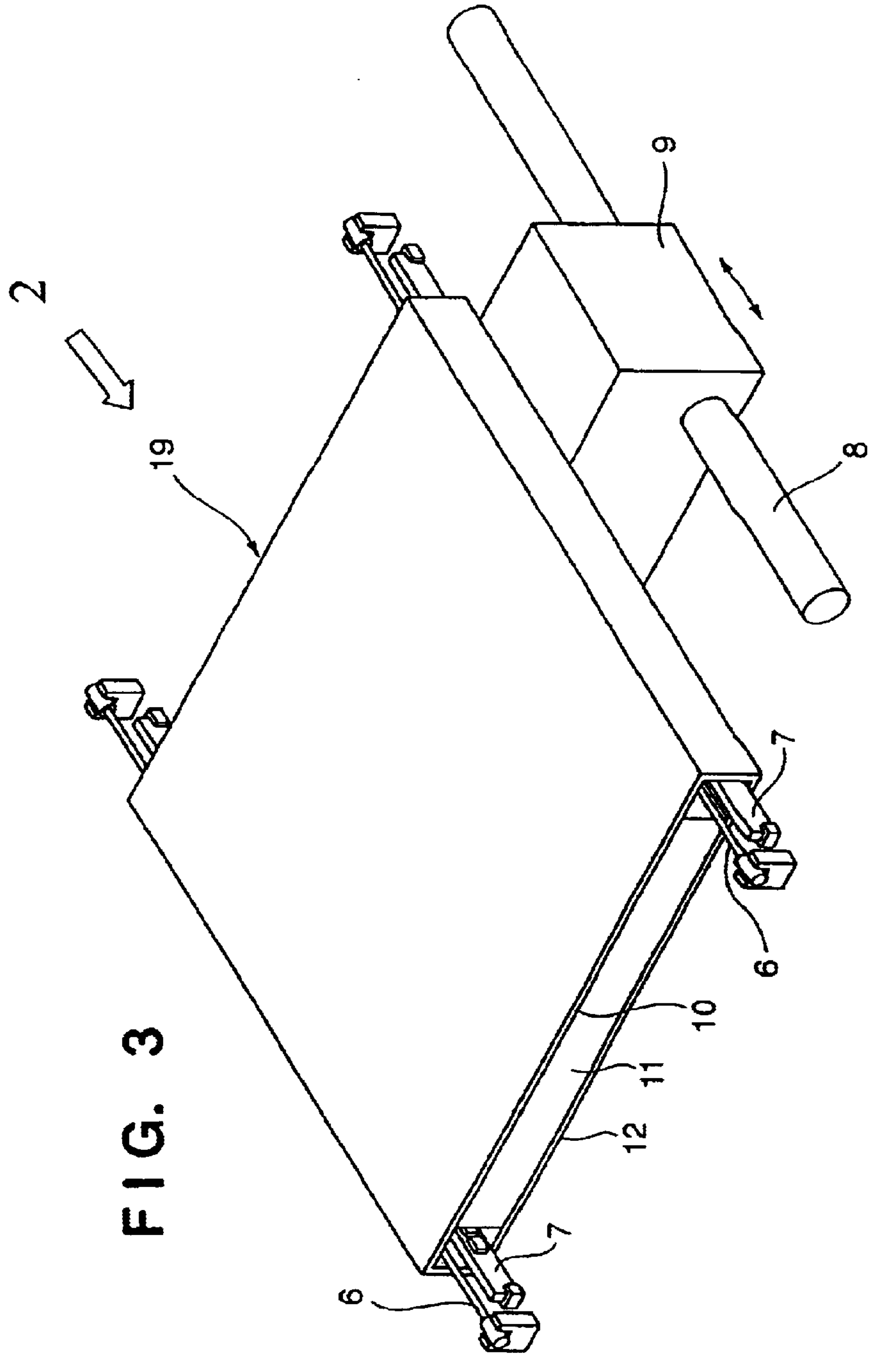
FIG. 3 is a schematic perspective view showing a transmission illumination unit according to the first embodiment.
Figure 4:
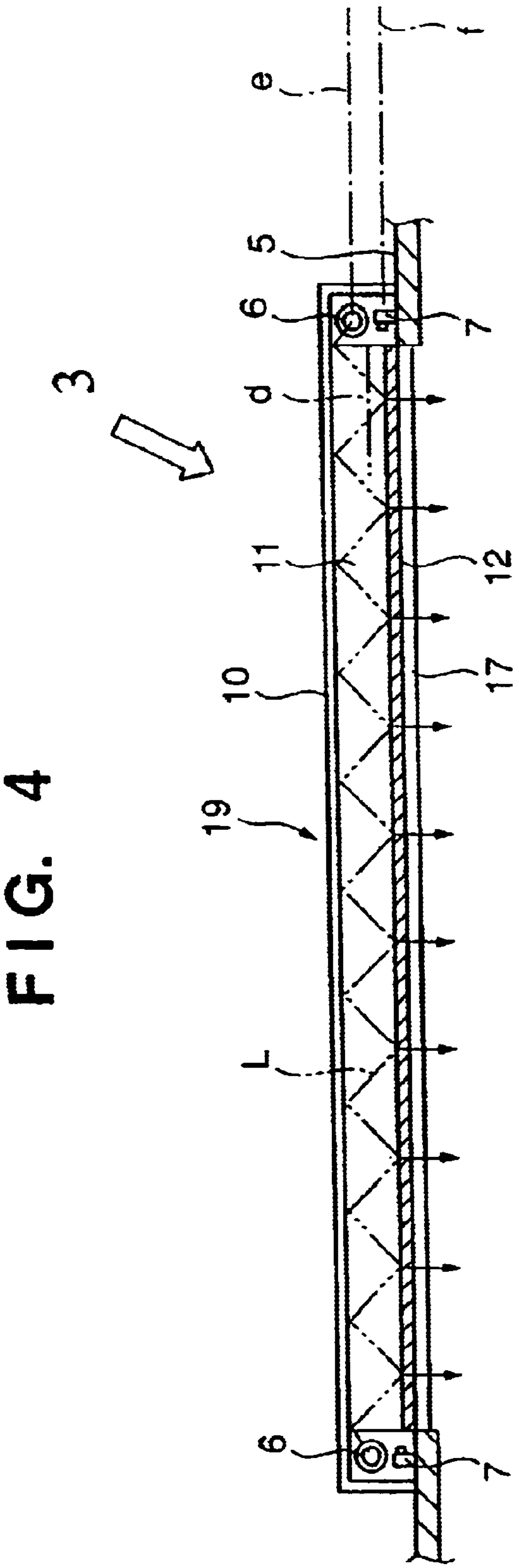
FIG. 4 is a schematic sectional view showing the transmission illumination unit according to the first embodiment.

FIG. 3 is a schematic perspective view showing the transmission illumination unit 2, and FIG. 4 is a sectional view showing the surface light source 3. The light source 3 is constituted by a light guide plate 19, transparent original reading lamps 6 such as fluorescent tubes or xenon lamps, and dirt/scratch detection lamps 7 formed from LEDs having an emission intensity in only the infrared region. The transparent original illumination lamps 6 emit light of only the visible region, but may emit light of the invisible region such as the infrared region as far as the lamps 6 mainly emit light of the visible region. The dirt/scratch detection lamps 7 suffice to mainly emit light of the infrared region instead of emitting only light of the infrared region. Moreover, a light source other than a fluorescent tube, xenon lamp, and LED may be used. The transparent original reading lamps 6 and dirt/scratch detection lamps 7 are parallel-arranged in the vertical direction along two sides perpendicular to the moving direction of a carriage 9 in the longitudinal direction of the light guide plate 19. The central axis (e) of each lamp 6 is arranged nearer the center (d) of thickness of the light guide plate 19 than the central axis (f) of a corresponding lamp 7. That is, $|d-e|<|d-f|$ holds, which increases the space efficiency. Note that the lamps 6 and 7 suffice to be arranged along at least one side, and may be arranged along sides parallel to the moving direction of the carriage 9. Each lamp 6 and each lamp 7 need not be vertically arranged.

The light guide plate 19 is a resin light guide diffusion panel comprised of a light guide portion 11 for guiding illumination light L in a two-dimensional longitudinal direction by internal reflection, a reflection sheet 10 for reflecting in the original direction the light guided by the light guide portion 11, and a diffusion sheet 12 for making the light reflected by the reflection sheet 10 uniform.

Light L emitted by the transparent original reading lamps 6 and dirt/scratch detection lamps 7 propagates through the light guide portion 11 in the two-dimensional longitudinal direction while being reflected between the reflection sheet 10 and the diffusion sheet 12. Part of the light incident on the diffusion sheet 12 diffuses, and the entire surface of the light guide plate 19 emits light.

Figure 5:
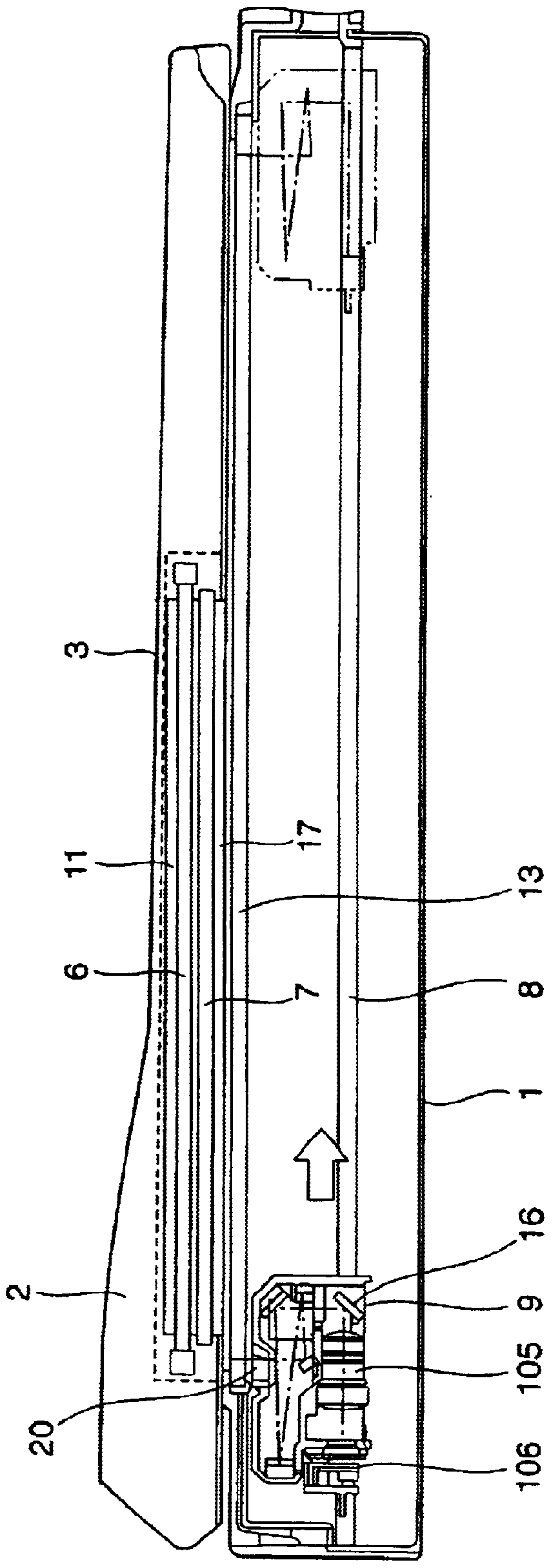
FIG. 5 is a sectional view showing the image reading apparatus according to the first embodiment.

FIG. 5 is a sectional view showing the image reading apparatus according to the first embodiment. The carriage 9 of the image reading apparatus 1 supports a reflection original illumination lamp 20, the CCD line sensor 106, the lens 105, and a reflecting mirror 16. The CCD line sensor 106 converts an image into an electric image signal and is constituted by a plurality of aligned image sensing elements. The carriage 9 is fit on a carriage guide shaft 8 and is movable in the subscanning direction.

Reading operation of a transparent original will be described.

When the reflection original illumination lamp 20 and dirt/scratch detection lamp 7 are turned off, the transparent original lamp 6 is turned on, and the whole surface light source 3 emits light. The carriage 9 is moved in the sub-scanning direction to project image information on the transparent original onto the CCD 106 through the reflecting mirror 16 and lens 105.

Subsequently, the reflection original illumination lamp 20 and transparent original illumination lamp 6 are turned off, the dirt/scratch detection lamp 7 is turned on, and the whole surface light source 3 emits light. The carriage 9 is moved in the subscanning direction to project dirt, a scratch, or the like on the transparent original onto the CCD 106 through the reflecting mirror 16 and lens 105. Since light from the dirt/scratch detection lamp 7 includes only an infrared component, a transparent original such as a negative or positive original transmits the infrared component regardless of the image (photosensitive image), and an image of dirt, a scratch, or the like which physically shields the optical path is projected as a shadow on the CCD 106. Hence, the dirt or scratch can be accurately detected.

Image processing is done for both the obtained dirt/dust-detected image and transparent original-read image. A defective region owing to the dirt or scratch recognized on the dirt/dust-detected image is interpolated from its ambient original-read image. Accordingly, a high-quality transparent original image free from the influence of the dirt or scratch can be read.

In the first embodiment, dirt or a scratch on a transparent original is read. It is also possible that defect information of all dirt, scratches, and the like present on an optical path extending from the light guide plate to the CCD is read by the above-described method in addition to dirt or a scratch present on an original, thereby excluding the influence.

(Second Embodiment)

Figure 6:
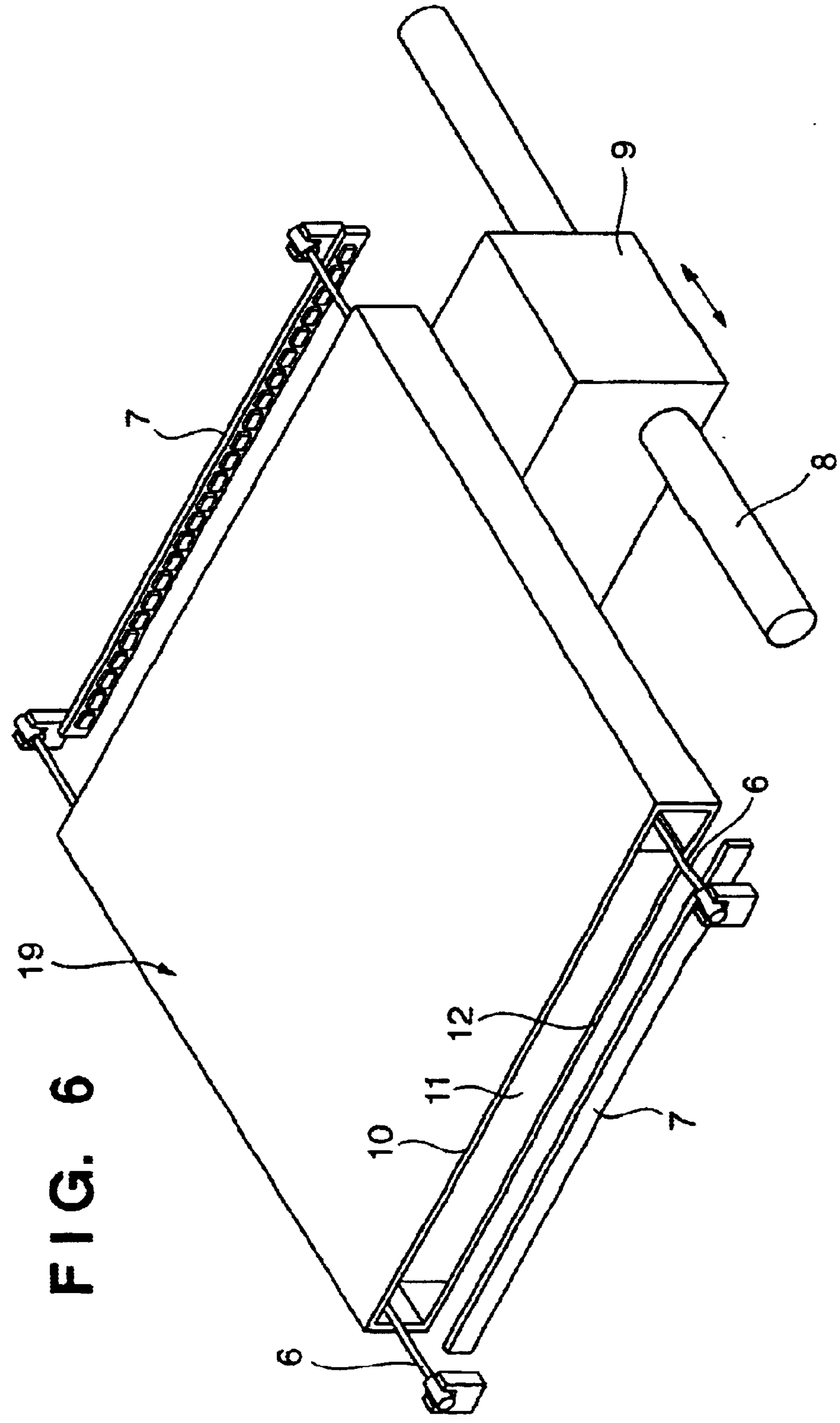
FIG. 6 is a schematic perspective view showing a transmission illumination unit according to the second embodiment.
Figure 7A:
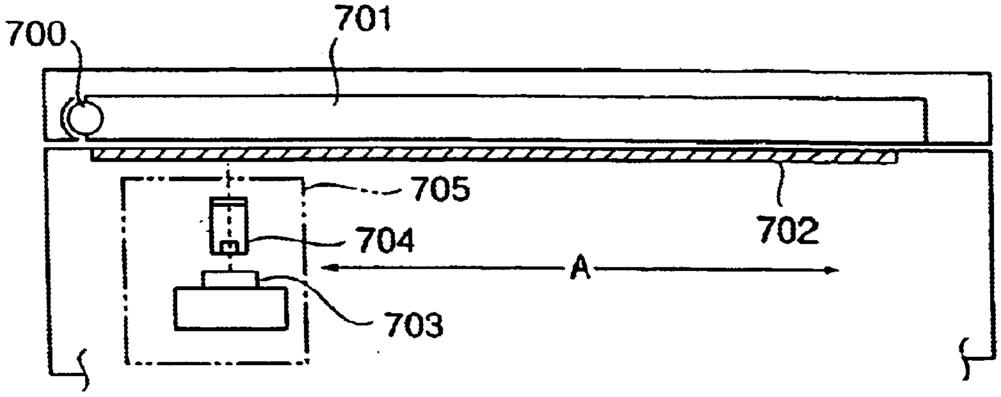
FIG. 7A Prior Art
FIGS. 7A and 7B are a sectional view and perspective view, respectively, showing a conventional image reading apparatus.
Figure 7B:
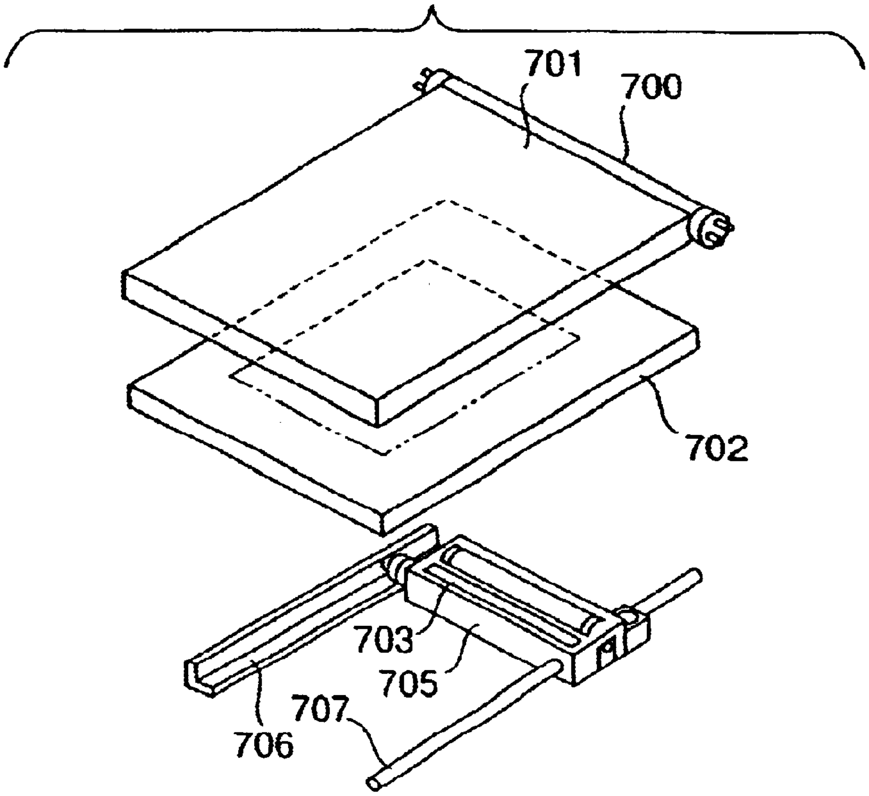
FIG. 7B Prior Art

FIG. 6 is a schematic perspective view showing the transparent original unit of an image reading apparatus according to the second embodiment of the present invention. In the second embodiment, transparent original reading lamps 6 and dirt/scratch detection lamps 7 are arranged on a light guide plate 19 along different sides of the light guide plate 19 that are perpendicular to each other.

The transparent original reading lamps 6 are arranged along the long sides of the rectangular light guide plate 19, whereas the dirt/scratch detection lamps 7 are arranged along the short sides.

Even with this arrangement, a high-quality transparent original image free from any dirt or scratch can be read.

As has been described above, according to the above embodiments, the image reading apparatus using a surface light source can attain a high-quality read image free from any dirt or scratch.

The above embodiments have exemplified a transparent original, but the present invention may be applied to a reflection original. Invisible light may be ultraviolet rays other than infrared rays. The second information may be watermark information other than dirt or a scratch.

The present invention is not limited to the above embodiments and various changes and modifications can be made within the spirit and scope of the present invention. Therefore, to apprise the public of the scope of the present invention the following claims are made.

What is claimed is:

1. An image reading apparatus comprising:

a first light source adapted to emit light of a visible region;

a second light source adapted to emit light of an invisible region;

a light guide plate which is parallel to an image plane to be read, and covers an image region to be read, and is configured to dispose said first and second light sources at an end face, wherein said light guide plate is adapted to guide incident light from said first and second light sources in a longitudinal direction along a surface of said light guide plate, and to uniformly emit the incident light from the surface which is perpendicular to an incident surface of light emitted from said first and second light source, and is larger than the incident surface, and covers the image region to be read;

an image information reading unit adapted to read image information recorded on an original, on the basis of the light from said first light source that is guided by said light guide plate;

a defect information reading unit adapted to read defect information present on an optical path extending from said light guide plate to image sensing unit, on the basis of the light from said second light source that is guided by said light guide plate; and a correction unit adapted to remove the defect information from the image information.

2. The apparatus according to claim 1, wherein the defect information includes information generated when dirt or a scratch present on the original itself shields light from said second light source that is guided by said light guide plate.

3. The apparatus according to claim 1, wherein said first and second light sources are parallel-arranged in a vertical direction along at least one side of said light guide plate.

4. The apparatus according to claim 3, wherein said first light source is arranged nearer a center of thickness of said light guide plate than said second light source.

5. The apparatus according to claim 1, wherein said first and second light sources are arranged along different sides of said light guide plate so as to be perpendicular to each other.

6. The apparatus according to claim 5, wherein said first light source is arranged along a longer side of said light guide plate, and said second light source is arranged along a shorter side.

7. An image reading apparatus comprising:

a first light source adapted to mainly emit light of a visible region;

a second light source adapted to mainly emit light of an invisible region;

a light guide plate which is parallel to an image plane to be read, and covers an image region to be read, and is adapted to guide light emitted by said first and second light sources in a longitudinal direction along a surface of said light guide plate and to illuminate overall image region of a transparent original by emitting the light from the surface which is perpendicular to an incident surface of light emitted from said first and second light source, and is larger than the incident surface, and covers the image region to be read; and a reading unit adapted to read transmitted light of the transparent original illuminated with light from said first or second light source that is guided by said light guide plate.

8. The apparatus according to claim 7, wherein said second light source mainly emits light of an infrared region.

9. The apparatus according to claim 7, wherein defect information present on an optical path extending from said light guide plate to an image sensing unit is read on the basis of the light from said second light source that is guided by said light guide plate.

10. The apparatus according to claim 9, wherein the defect information includes information generated when dirt or a scratch present on the transparent original itself shields light from said second light source that is guided by said light guide plate.

11. The apparatus according to claim 7, wherein said first and second light sources are parallel-arranged along at least one side of said light guide plate.

12. The apparatus according to claim 11, wherein said first light source is arranged nearer a center of thickness of said light guide plate than said second light source.

13. The apparatus according to claim 7, wherein said first and second light sources are arranged along different sides of said light guide plate.

14. The apparatus according to claim 13, wherein said first light source is arranged along a longer side of said light guide plate, and said second light source is arranged along a shorter side.

15. An illumination apparatus used in an image reading apparatus said illumination apparatus comprising:

a first light source adapted to emit light of a visible region;

a second light source adapted to emit light of an invisible region; and a light guide plate which is parallel to an image plane to be read, and covers an image region to be read, and is configured to dispose said first and second light sources at an end face, wherein said light guide plate is adapted to guide incident light from said first and second light sources in a longitudinal direction along a surface of said light guide plate, and to uniformly emit the incident light from the surface which is perpendicular to an incident surface on light emitted from said first and second light source, and is larger than the incident surface, and covers the image region to be read.

16. The apparatus according to claim 15, wherein said first light source is arranged at an end face of a longer side of said light guide plate, and said second light source is arranged along a shorter side.

17. The apparatus according to claim 15, wherein a distance between a center of said first light source and a center of depth of said light guide plate is shorter than a distance between a center of said second light source and the center of depth of said light guide plate.

18. The apparatus according to claim 15, wherein said first light source includes a fluorescent tube, and said second light source includes an LED.

19. The apparatus according to claim 16, wherein the longer and shorter sides are perpendicular to each other.

* * * * *

UNITED STATES PATENT AND TRADEMARK OFFICE
CERTIFICATE OF CORRECTION

PATENT NO. : 6,660,987 B2
DATED : December 9, 2003
INVENTOR(S) : Masato Koshimizu It is certified that error appears in the above-identified patent and that said Letters Patent is hereby corrected as shown below:

Title page,
Item [56], References Cited, U.S. PATENT DOCUMENTS, should read:
-- 5,586,212 A * 12/1996 McConica et al.…358/146 --

Signed and Sealed this

Twelfth Day of April, 2005

JON W. DUDAS
*Director of the United States Patent and Trademark Office*